(12) United States Patent
Huang et al.

(10) Patent No.: US 6,920,045 B2
(45) Date of Patent: Jul. 19, 2005

(54) HEAT-DISSIPATING ASSEMBLY

(75) Inventors: Wen-shi Huang, Jungli (TW);
Kuo-cheng Lin, Taoyuan (TW);
Li-kuang Tan, Taoyuan (TW);
Yu-hung Huang, Ilan (TW)

(73) Assignee: Delta Electronics, Inc., Taoyuan (TW)

( * ) Notice: Subject to any disclaimer, the term of this patent is extended or adjusted under 35 U.S.C. 154(b) by 0 days.

(21) Appl. No.: 10/417,734

(22) Filed: Apr. 16, 2003

(65) Prior Publication Data

US 2004/0120115 A1 Jun. 24, 2004

(30) Foreign Application Priority Data

Dec. 24, 2002 (TW) ........................................ 9122103 U

(51) Int. Cl.⁷ .................................................. H05K 7/20
(52) U.S. Cl. .................. 361/700; 361/698; 165/104.26; 165/104.33; 174/15.2; 257/715
(58) Field of Search ................................ 361/690–697, 361/700, 709, 710; 257/706, 714, 715, 721, 722; 174/15.1, 15.2, 16.1, 16.3; 165/80.3–80.4, 121–126, 104.26

(56) References Cited

U.S. PATENT DOCUMENTS

| | | | | |
|---|---|---|---|---|
| 5,751,549 A | * | 5/1998 | Eberhardt et al. | .......... 361/687 |
| 5,946,188 A | * | 8/1999 | Rochel et al. | ............... 361/690 |
| 6,020,820 A | * | 2/2000 | Chiang | ........................ 340/584 |
| 6,067,227 A | * | 5/2000 | Katsui et al. | ................ 361/695 |
| 6,181,556 B1 | * | 1/2001 | Allman | ........................ 361/690 |
| 6,360,814 B1 | * | 3/2002 | Tanaka et al. | .......... 165/104.33 |
| 6,394,175 B1 | * | 5/2002 | Chen et al. | ................ 165/80.3 |
| 6,396,675 B1 | * | 5/2002 | Su | .............................. 361/103 |
| 6,398,505 B1 | * | 6/2002 | Sekiguchi | ...................... 417/2 |
| 6,450,251 B1 | * | 9/2002 | Lin et al. | ..................... 165/122 |
| 6,487,076 B1 | * | 11/2002 | Wang | ......................... 361/697 |
| 6,496,368 B2 | * | 12/2002 | Jui-Yuan | ..................... 361/697 |
| 6,501,648 B2 | * | 12/2002 | Huang et al. | ................ 361/687 |
| 6,537,019 B1 | * | 3/2003 | Dent | ............................. 415/61 |
| 6,717,811 B2 | * | 4/2004 | Lo et al. | ..................... 361/698 |
| 2002/0189789 A1 | * | 12/2002 | Lin | ............................ 165/80.3 |
| 2003/0140636 A1 | * | 7/2003 | Van Winkle | ................ 62/3.61 |

FOREIGN PATENT DOCUMENTS

| | | |
|---|---|---|
| CN | 2342407 | 10/1999 |
| JP | 2001-183791 A | 7/2001 |
| TW | 420326 | 1/2001 |
| TW | 450355 | 8/2001 |
| TW | 509348 | 11/2002 |
| TW | 511876 | 11/2002 |
| TW | 572245 | 1/2004 |

* cited by examiner

*Primary Examiner*—Boris Chervinsky
(74) *Attorney, Agent, or Firm*—Birch, Stewart, Kolasch & Birch, LLP.

(57) ABSTRACT

A heat-dissipating assembly utilizes a heat conductor having a high thermal conductivity to stagedly and effectively dissipate the heat to the surrounding environment. The heat-dissipating assembly includes a plurality of heat portions, at least one fan being disposed on the surface or side of the heat-dissipating portions, and a heat conductor having a high thermal conductivity connected within the plurality of the heat-dissipating portions.

25 Claims, 4 Drawing Sheets

HEAT-DISSIPATING ASSEMBLY

BACKGROUND OF THE INVENTION (a) Field of the Invention

The invention relates to a heat-dissipating assembly and, more particularly, to a multi-level heat sink for dissipating heat in electronic products (for instance, CPUs of computers), which can effectively dissipate heat generated by the electronic products to the surrounding environment.

(b) Description of the Related Art

Following continuous improvements in performance of electronic devices, heat-dissipating assemblys or systems have become indispensable components. If the heat generated by individual components within the electronic device cannot be appropriately dissipated, in a less serious situation, the performance thereof is reduced, and in a more serious situation, the electronic device may be burnt and damaged. As a result, the surfaces or sides of the electronic component (for instance, the CPU of a computer) which produced a great amount of heat is generally mounted on a heat sink so as to dissipate the generated heat.

Conventionally, a heat-dissipating assembly 1 as shown in FIG. 1 is mounted on the surface of the heat-generating component (for instance, a CPU) to dissipate the heat generated in the component. An axial fan 12 is mounted on an upper surface of a heat sink 11, and a bottom surface 111 of the heat sink 11 is mounted on the CPU. The heat generated during the operation of the CPU is rapidly transferred to the heat sink 11, and by means of air flow from the axial fan 12, the accumulated heat at the heat sink 11 is dissipated.

However, if the heat sink 11 is made too high, the heat-dissipation effect is poor. Further, in the development or improvement of the heat sink, the fins of the heat sink cannot be optionally and unrestrictedly extended or lengthened. These methods not only affect the flowrate and the air pressure of the fan, but also affect the design of the fin thickness. Thus, it is an important subject of the invention to provide a heat-dissipating assembly which can effectively dissipate heat generated by the electronic components to the surrounding environment.

SUMMARY OF THE INVENTION

Accordingly, it is an object of the invention to provide a heat-dissipating assembly, using a heat conductor with a high thermal conductivity and to stagedly and effectively dissipate the heat to the surrounding environment.

The multiple-level heat-dissipating assembly in accordance with the invention includes a plurality of heat-dissipating portions, at least one fan mounted on a surface or a side of the plurality of the heat-dissipating portions, and at least one heat conductor with a high thermal conductivity connected within the plurality of heat-dissipating portions.

Preferably, each of the plurality of heat-dissipating portion includes a plurality of fins, and the fins are made from a material selected from the group consisting of aluminum, an aluminum alloy, copper, a copper alloy and a mixture of the above.

Preferably, the plurality of heat-dissipating portions are disposed by stacking form up to bottom or in a left and right arrangement (i.e. vertically or horizontally arranged) and are coupled with a bridge portion. The plurality of heat-dissipating portions and the bridge portion are integrally formed as a unit. The heat conductor is inserted in the plurality of heat-dissipating portions and the bridge portion.

Preferably, the heat conductor is a heat pipe, and is made from a material selected from the group consisting of gold, silver, aluminum, copper and a mixture of the above.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENT

Figure 1:
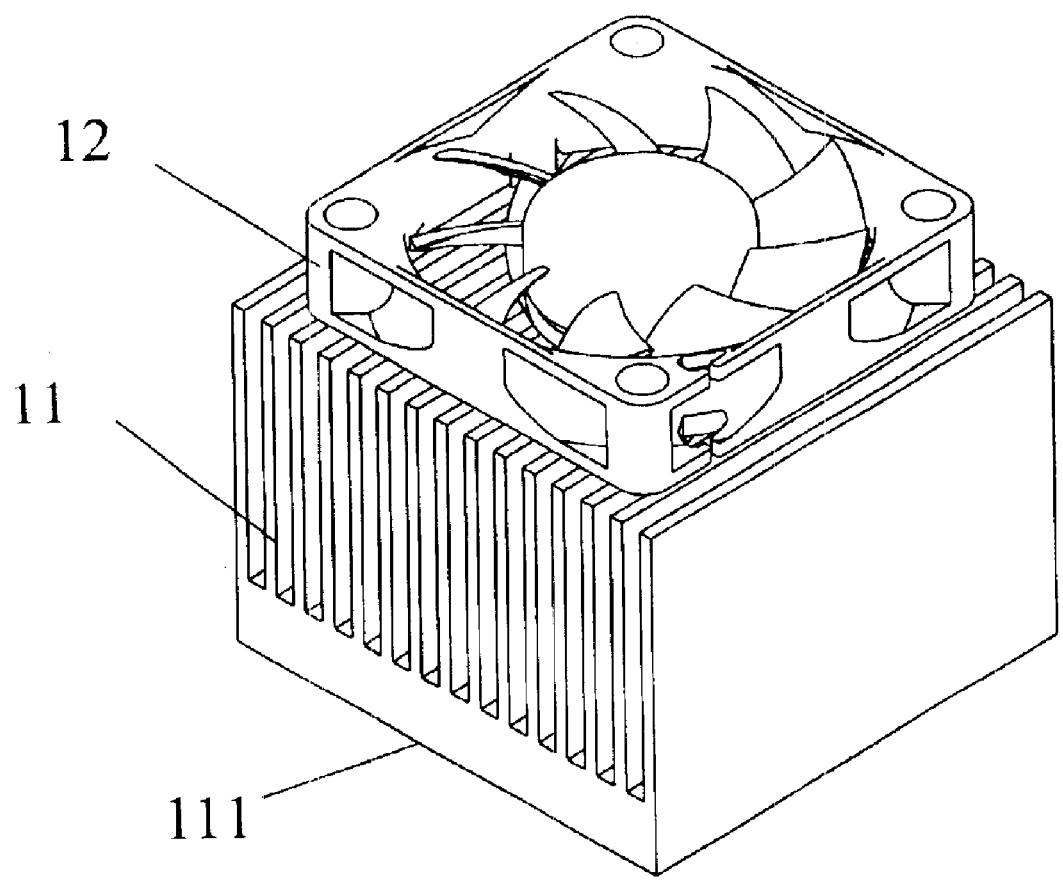
FIG. 1 is a perspective view of a conventional heat-dissipating assembly.
Figure 2A:
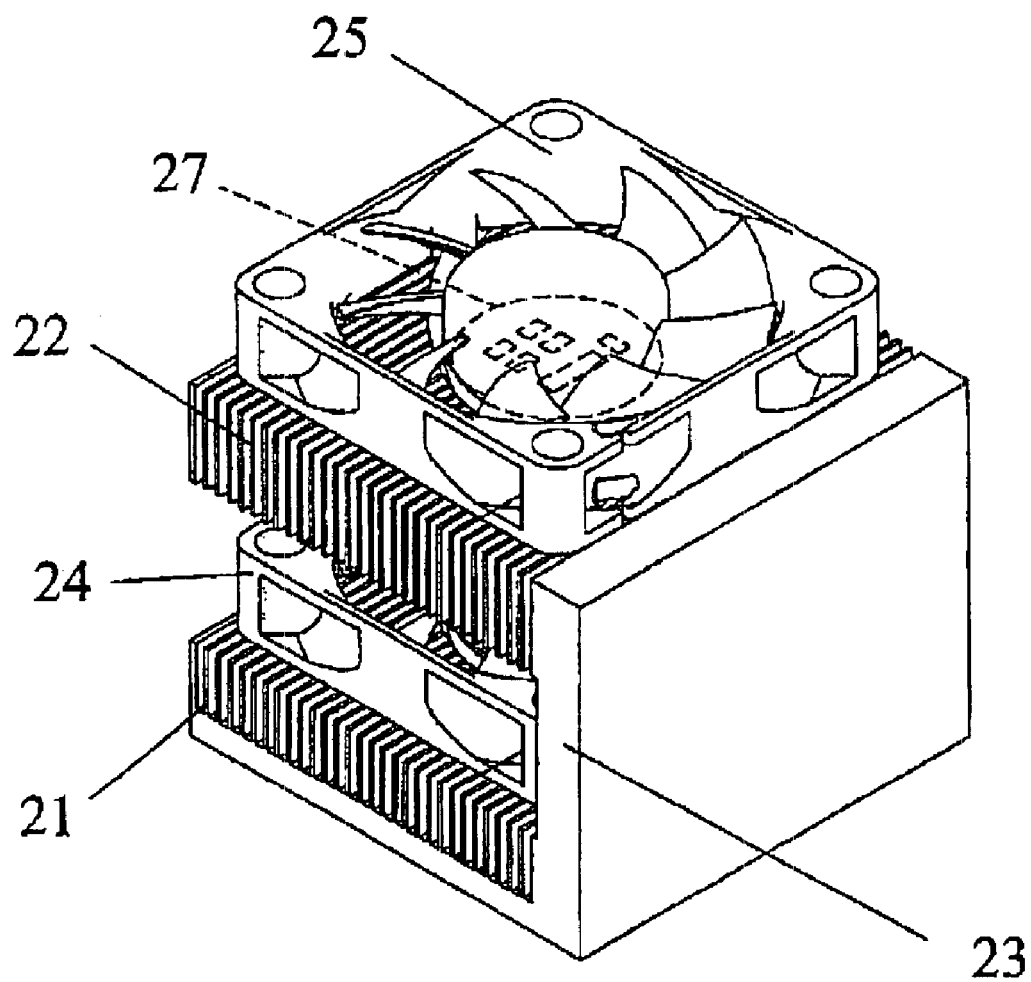
FIG. 2A is a perspective view of a heat-dissipating assembly in accordance with a preferred embodiment of the invention.

Referring to FIG. 2A illustrating a heat-dissipating assembly 2 of the invention, the heat-dissipating assembly 2 includes a first heat-dissipating portion 21, a second heat-dissipating portion 22, a bridge portion 23, and two fans 24, 25. The first heat-dissipating portion 21 has a bottom surface mounted on a surface of a heat-generating component, for instance, a CPU (not shown). The second heat-dissipating portion 22 is stacked over the first heat-dissipating portion 21 by means of the bridge portion 23. The two fans 24, 25 are disposed on the first heat-dissipating portion 21 and the second heat-dissipating portion 22, respectively. The first heat-dissipating portion 21 and the second heat-dissipating portion 22 are respectively provided with a plurality of fins to increase the heat-dissipating area thereof. The fins are made from aluminum, an aluminum alloy, copper, a copper alloy, or a mixture thereof. The first and second heat-dissipating portion 21, 22 and the bridge portion 23 can be made integrally as a unit.

Figure 3:
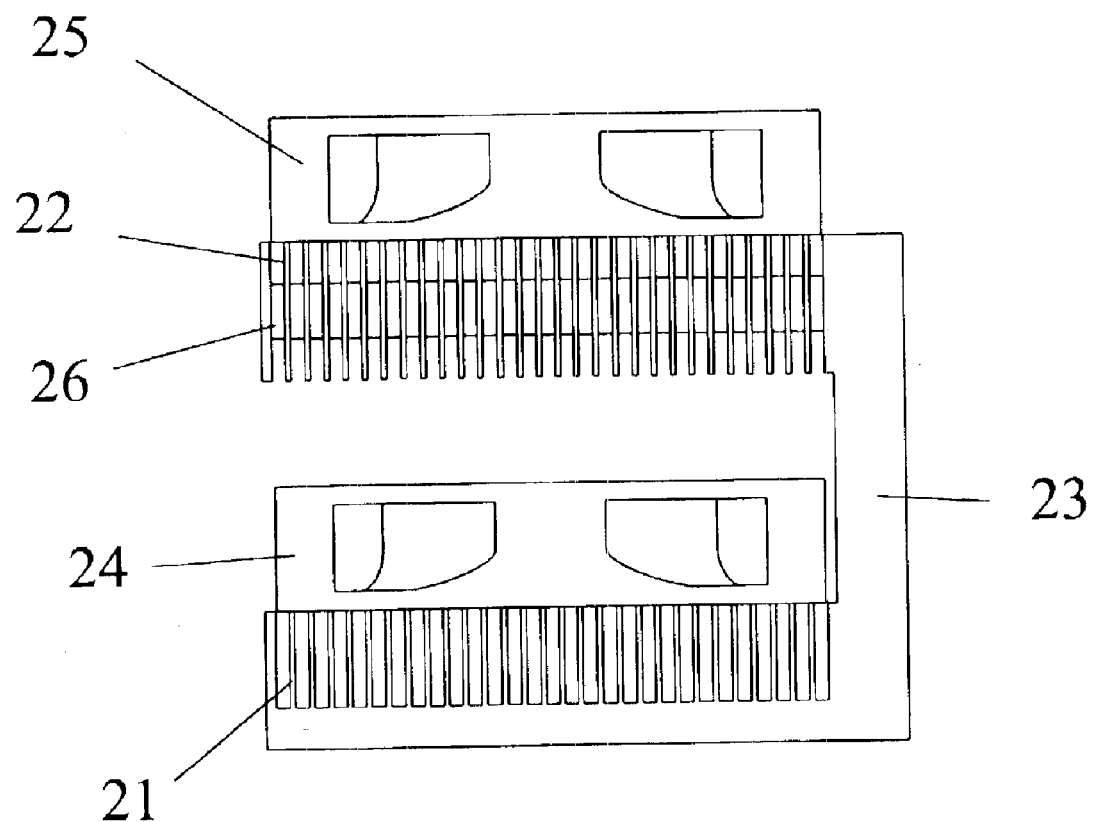
FIG. 3 is a side view of the heat-dissipating assembly in FIG. 2.

Additionally, the heat-dissipating assembly 2 further includes a heat conductor 26 having a high thermal conductivity, which is connected within the first heat-dissipating portion 21 and the second heat-dissipating portion 22. The heat conductor 26 is inserted into the second heat-dissipating portion 21, the bridge portion 23 and the bottom portion of the first heat-dissipating portion 21, as shown in FIG. 3. The heat conductor 26 can be a heat pipe, which can be made from gold, silver, aluminum, copper or the mixtures of the above.

Since the bottom surface of the first heat-dissipating portion 21 is to be mounted on a heat-generating element (not shown), the heat generated during the operation of the heat-generating element will be rapidly transferred to the first heat-dissipating portion 21. In addition, a part of the heat will be dissipated together with the air flow of the axial fan 24 positioned at the top of the first heat-dissipating portion 21. The remaining of the heat will be rapidly transferred to the second heat-dissipating portion 22 by means of the heat conductor 26, and is then dissipated to the surrounding environment through the air flow of the axial fan 25 positioned at the top of the second heat-dissipating portion 22. Since the air flow can pass through the space between the first heat-dissipating portion 21 and the second heat-dissipating portion 22 to the fan 24, the heat generated by the heat-generating component is effectively and rapidly dissipated.

In addition, the heat-dissipating assembly 2 further includes a control element 27 mounted therein or outside. When the fan 24 does not function, the control element will output a signal to increase the rotational speed of the fan 25 so as to maintain the required heat-dissipating effect, or vice versa.

In this embodiment, the two-level heat-dissipating assembly makes use of a thermal conductor having a high thermal conductivity as a medium. The lower portion of the heat-dissipating assembly is a heat-dissipating module and the upper portion is another heat-dissipating module. The lower portion effectively dissipates a part of the heat, and through the medium with a high thermal conductivity, the remaining of the heat is effectively transferred to the upper portion and dissipated therefrom. It is obvious that the heat-dissipating assembly in accordance with the invention does not restrict to the two-level stack, it can be a three-level stack. As for the fans used in the heat-dissipating assembly, it is not restricted to the axial fans as shown in FIG. 2A centrifugal fans can also be used based on the application of the heat-dissipating assembly.

Figure 2B:
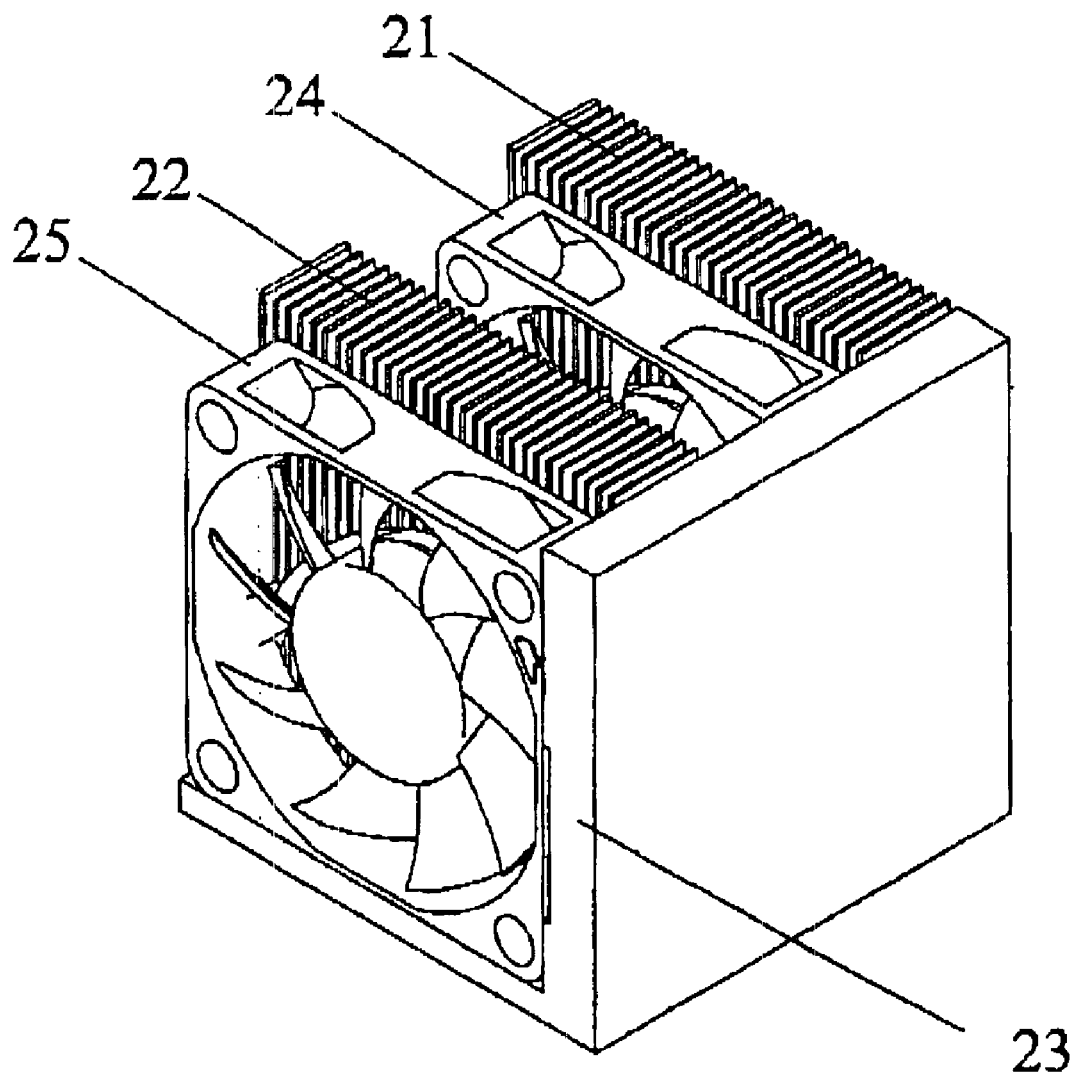
FIG. 2B is a perspective view of a heat-dissipating assembly arranged in a horizontal array in accordance with a preferred embodiment of the invention.

In view of the above, the invention uses a thermal conductor having a high thermal conductivity to transfer heat, and uses a multi-level way to stagedly transfer the heat to the surrounding environment. Except that a plurality of heat-dissipating portions of the multi-level heat-dissipating device are stacked in a vertical array, they can also be arranged in a horizontal array as shown in FIG. 2B. Thus, the object to rapidly and effectively transfer heat can be achieved.

While the invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the invention.

What is claimed is:

1. A heat-dissipating assembly comprising:
   a plurality of heat-dissipating portions;
   a bridge portion connecting said heat-dissipating portions;
   at least one fan disposed on a surface or a side of the plurality of heat-dissipating portions; and
   a heat conductor having a high thermal conductivity and connected within the plurality of heat-dissipating portions; wherein
   the plurality of heat-dissipating portions and the bridge portion are an integral unit.

2. The heat-dissipating assembly of claim 1, wherein the heat-dissipating portions are provided with a plurality of fins.

3. The heat-dissipating assembly of claim 2, wherein the fins are made from a material selected from the group consisting of aluminum, aluminum alloy, copper, a copper alloy and mixtures of the above.

4. The heat-dissipating assembly of claim 1, wherein the heat conductor is in contact with at least one of the heat-dissipating portions and the bridge portion.

5. The heat-dissipating assembly of claim 1, wherein the heat conductor is a heat pipe.

6. The heat-dissipating assembly of claim 1, wherein the heat conductor is made from a material selected from the group consisting of gold, silver, aluminum, copper and a mixture of the above.

7. The heat-dissipating assembly of claim 1, wherein two fans are included in the heat-dissipating assembly, and further comprising a control element which outputs a signal when a first one of the fans is not functioning so as to increase a rotation speed of a second one of the fans.

8. A heat-dissipating assembly for dissipating heat generated by a heat-generating element to a surrounding environment, comprising:
   a first heat-dissipating portion mounted to a surface of the heat-generating element;
   a second heat-dissipating portion spaced apart from and coupled to the first heat-dissipation portion;
   a bridge portion connecting said heat-dissipating portions;
   at least one fan disposed on a surface or a side of the first heat-dissipating portion and the second heat-dissipating portion; and
   a heat conductor having a high thermal conductivity and connected with the first heat-dissipating portion and the second heat-dissipating portion; wherein
   the first heat-dissipating portion, the second heat-dissipating portion and the bridge portion are an integral unit.

9. The heat-dissipating assembly of claim 8, wherein the first heat-dissipating portion and the second heat-dissipating portion are respectively provided with a plurality of fins.

10. The heat-dissipating assembly of claim 9, wherein the fins are made from a material selected from the group consisting of aluminum, aluminum alloy, copper, copper alloy and mixtures of the above.

11. The heat-dissipating assembly of claim 8, wherein the heat conductor is in contact with the first heat-dissipating portion and the second heat-dissipating portion and the bridge portion.

12. The heat-dissipating assembly of claim 8, wherein the heat conductor is a heat pipe.

13. The heat-dissipating assembly of claim 8, wherein the heat conductor is made from a material selected from the group consisting of gold, silver, aluminum, copper and a mixture of the above.

14. The heat-dissipating assembly of claim 8, wherein two fans are included in the heat-dissipating assembly and further comprising a control element which outputs a signal when a first one of the fans is not functioning so as to increase a rotation speed of a second one of the fans.

15. A heat-dissipating assembly comprising:
   a plurality of heat-dissipating portions;
   a bridge portion that couples the plurality of heat-dissipating portions, wherein the plurality of heat-dissipating portions and the bridge portion are formed integrally as a unit;
   two fans disposed on the plurality of heat-dissipating portions;
   a heat conductor having a high thermal conductivity and connected to the plurality of heat-dissipating portions, and a control element which outputs a signal when a first one of the fans is not functioning so as to increase a rotation speed of a second one of the fans.

16. A heat-dissipating assembly for dissipating heat generated by a heat-generating element to a surrounding environment, comprising:

a first heat-dissipating portion mounted to a surface of the heat-generating element;

a second heat-dissipating portion spaced apart from and coupled to the first heat-dissipation portion;

a first fan disposed on the first heat-dissipation portion;

a second fan disposed on the second heat-dissipation portion; and a heat conductor having a high thermal conductivity and connected with the first heat-dissipating portion and the second heat-dissipating portion; wherein the air flow of the second fan can pass through the space between said heat-dissipating portions to the first fan so as to effectively dissipate the heat generated by the heat-generating element.

17. The heat-dissipating assembly of claim 16, wherein the heat-dissipating portions are provided with a plurality of fins.

18. The heat-dissipating assembly of claim 17, wherein the fins are made from a material selected from the group consisting of aluminum, aluminum alloy, copper, copper alloy and mixtures of the above.

19. The heat-dissipating assembly of claim 16, wherein the heat-dissipating portions are stacked from up to bottom, or disposed in a horizontal array.

20. The heat-dissipating assembly of claim 16, wherein the heat-dissipating portions are coupled by a bridge portion.

21. The heat-dissipating assembly of claim 20, wherein the heat-dissipating portions and the bridge portion are formed integrally as a unit.

22. The heat-dissipating assembly of claim 20, wherein the heat conductor is inserted into the heat-dissipating portions and the bridge portion.

23. The heat-dissipating assembly of claim 16, wherein the heat conductor is a heat pipe.

24. The heat-dissipating assembly of claim 16, wherein the heat conductor is made from a material selected from the group consisting of gold, silver, aluminum, copper and a mixture of the above.

25. The heat-dissipating assembly of claim 16, further comprising a control element which outputs a signal when the first fan or the second fan is not functioning so as to increase a rotation speed of the other fan.

* * * * *